(12) United States Patent
Chu et al.

(10) Patent No.: US 12,307,059 B2
(45) Date of Patent: May 20, 2025

(54) TOUCH DISPLAY APPARATUS

(71) Applicant: LG Display Co., Ltd., Seoul (KR)

(72) Inventors: Dong Il Chu, Paju-si (KR); Jae Won Lee, Paju-si (KR); Tae Gyu Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 41 days.

(21) Appl. No.: 17/976,145

(22) Filed: Oct. 28, 2022

(65) Prior Publication Data

US 2023/0214075 A1    Jul. 6, 2023

(30) Foreign Application Priority Data

Dec. 30, 2021    (KR) .................. 10-2021-0192809

(51) Int. Cl.
*G06F 3/041* (2006.01)
*G06F 3/044* (2006.01)

(52) U.S. Cl.
CPC .......... *G06F 3/0446* (2019.05); *G06F 3/0412* (2013.01); *G06F 3/04164* (2019.05); *G06F 2203/04111* (2013.01)

(58) Field of Classification Search
None
See application file for complete search history.

(56) References Cited

U.S. PATENT DOCUMENTS 11,586,332 B2    2/2023 Lu
2019/0018530 A1*   1/2019 Lee .................. H10K 50/8445
2021/0005676 A1   1/2021 Park et al.
2021/0200365 A1   7/2021 Lee et al.
2021/0397305 A1   12/2021 Cho et al.
2022/0206636 A1   6/2022 Lu

FOREIGN PATENT DOCUMENTS

CN    112698746 A    4/2021
EP    3754455 A1    12/2020

OTHER PUBLICATIONS

Intellectual Property Office of the United Kingdom, Combined Search and Examination Report, United Kingdom Patent Application No. GB2216261.4, Jun. 12, 2023, 15 pages.

\* cited by examiner

*Primary Examiner* — Brian M Butcher
(74) *Attorney, Agent, or Firm* — Fenwick & West LLP (57) ABSTRACT

A touch display apparatus is provided. The touch display apparatus may include a touch sensor on an encapsulating layer that covers light-emitting devices. The touch sensor may include first touch electrodes connected in a first direction by first bridge electrodes, and second touch electrodes connected by second bridge electrodes in a second direction that is different from the first direction. A light-blocking pattern may be disposed on the first touch electrodes and the second touch electrodes. The light-blocking pattern may include a conductive material having a lower reflectance than reflectances of the first touch electrodes and the second touch electrodes. The light-blocking pattern may comprise of a first light-blocking pattern electrically connected to the first touch electrodes and a second light-blocking pattern electrically connected to the second touch electrodes. Thus, in the touch display apparatus, the reliability of the touch sensor may be improved by the light-blocking pattern.

13 Claims, 9 Drawing Sheets

TOUCH DISPLAY APPARATUS

CROSS-REFERENCE TO RELATED APPLICATIONS

This application claims the benefit of Republic of Korea Patent Application No. 10-2021-0192809, filed on Dec. 30, 2021, which is hereby incorporated by reference in its entirety.

BACKGROUND

Field of Technology

The present disclosure relates to a touch display apparatus in which a touch sensor is disposed on light-emitting devices.

Discussion of the Related Art

Generally, a display apparatus provides an image to user. For example, the display apparatus may include a plurality of light-emitting device. Each of the light-emitting devices may emit light displaying a specific color. For example, each of the light-emitting devices may include a light-emitting layer disposed between a first emission electrode and a second emission electrode.

The display apparatus may perform a specific program or apply a specific signal by a touch of user and/or a tool. For example, the display apparatus may be a touch display apparatus including a touch sensor. The touch sensor may be disposed on an encapsulating unit covering the light-emitting devices. For example, the touch sensor may include first touch electrodes disposed side by side on the encapsulating unit, first bridge electrodes connecting the first touch electrodes in a first direction, second touch electrodes disposed between the first touch electrodes, and second bridge electrodes connecting the second touch electrodes in a second direction perpendicular to the first direction.

The first touch electrodes, the first bridge electrodes, the second touch electrodes, and the second bridge electrodes may include a conductive material. For example, the first touch electrodes, the first bridge electrodes, the second touch electrodes, and the second bridge electrodes may include a metal. The first touch electrodes, the first bridge electrodes, the second touch electrodes, and the second bridge electrodes may be disposed outside the light-emitting devices. Thus, in the touch display apparatus, an area of emission areas in which the light-emitting devices are disposed may be affected by a width of the first touch electrodes and the second touch electrodes. However, in the touch display apparatus, when the width of the first touch electrodes and the second touch electrode are reduced, the reliability of touch sensing may be deteriorated due to the increase in resistance.

SUMMARY

Accordingly, the present disclosure is directed to a touch display apparatus that substantially obviates one or more problems due to limitations and disadvantages of the related art.

An object of the present disclosure is to provide a touch display apparatus capable of reducing the resistance of the first touch electrodes and the second touch electrodes without reducing the area of the emission areas.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the present disclosure, as embodied and broadly described herein, there is provided a touch display apparatus comprising: a plurality of light-emitting devices on a display area of a device substrate; an encapsulating layer on the device substrate, the encapsulating layer covering the plurality of light-emitting devices; a touch insulating layer on the encapsulating layer; a first touch line on the touch insulating layer, the first touch line including first touch electrodes and first bridge electrodes that electrically connect the first touch electrodes in a first direction; a second touch line including second touch electrodes and second bridge electrodes, the second bridge electrodes between the encapsulating layer and the touch insulating layer, and electrically connecting the second touch electrodes in a second direction that is different from the first direction; a touch passivation layer on the touch insulating layer, the touch passivation layer covering the first touch electrodes, the first bridge electrodes, and the second touch electrodes; a first light-blocking pattern on the touch passivation layer, the first light-blocking pattern electrically connected to the first touch electrodes and the first bridge electrodes; and a second light-blocking pattern on the touch passivation layer, the second light-blocking pattern electrically connected to the second touch electrodes, wherein the first light-blocking pattern and the second light-blocking pattern have a reflectance that is less than reflectances of the first touch electrodes, the first bridge electrodes, and the second touch electrodes.

In one embodiment, a touch display apparatus comprising: a substrate including a display area; a plurality of light-emitting devices on the display area; a touch sensor including a plurality of touch electrodes that are arranged in a plurality of touch lines on the display area; a plurality of touch routing lines that are connected to the plurality of touch lines; and a first conductive pattern overlapping a first touch electrode from the plurality of touch electrodes and electrically connected to the first touch electrode, the first conductive pattern patterned to be non-overlapping with the plurality of light emitting-devices.

In one embodiment, a touch display apparatus comprising: a substrate including a display area; a plurality of light-emitting devices on the display area; a touch sensor including a plurality of touch electrodes that are arranged in a plurality of touch lines on the display area; a plurality of touch routing lines that are connected to the plurality of touch lines; and a first conductive pattern having a shape that matches a shape of the first touch electrode such that a first portion of an outer periphery of the first conductive pattern is aligned with an outer periphery of the first touch electrode, the first conductive pattern electrically connected to the first touch electrode.

BRIEF DESCRIPTION OF THE DRAWINGS

The accompanying drawings, which are included to provide a further understanding of the present disclosure and are incorporated in and constitute a part of this application, illustrate embodiment(s) of the present disclosure and together with the description serve to explain the principle of the present disclosure. In the drawings.

DETAILED DESCRIPTION

Hereinafter, details related to the above objects, technical configurations, and operational effects of the embodiments of the present disclosure will be clearly understood by the following detailed description with reference to the drawings, which illustrate some embodiments of the present disclosure. Here, the embodiments of the present disclosure are provided in order to allow the technical sprit of the present disclosure to be satisfactorily transferred to those skilled in the art, and thus the present disclosure may be embodied in other forms and is not limited to the embodiments described below.

In addition, the same or extremely similar elements may be designated by the same reference numerals throughout the specification and in the drawings, the lengths and thickness of layers and regions may be exaggerated for convenience. It will be understood that, when a first element is referred to as being "on" a second element, although the first element may be disposed on the second element so as to come into contact with the second element, a third element may be interposed between the first element and the second element.

Here, terms such as, for example, "first" and "second" may be used to distinguish any one element with another element. However, the first element and the second element may be arbitrarily named according to the convenience of those skilled in the art without departing the technical sprit of the present disclosure.

The terms used in the specification of the present disclosure are merely used in order to describe particular embodiments, and are not intended to limit the scope of the present disclosure. For example, an element described in the singular form is intended to include a plurality of elements unless the context clearly indicates otherwise. In addition, in the specification of the present disclosure, it will be further understood that the terms "comprises" and "includes" specify the presence of stated features, integers, steps, operations, elements, components, and/or combinations thereof, but do not preclude the presence or addition of one or more other features, integers, steps, operations, elements, components, and/or combinations.

And, unless 'directly' is used, the terms "connected" and "coupled" may include that two components are "connected" or "coupled" through one or more other components located between the two components.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Embodiment

Figure 1:
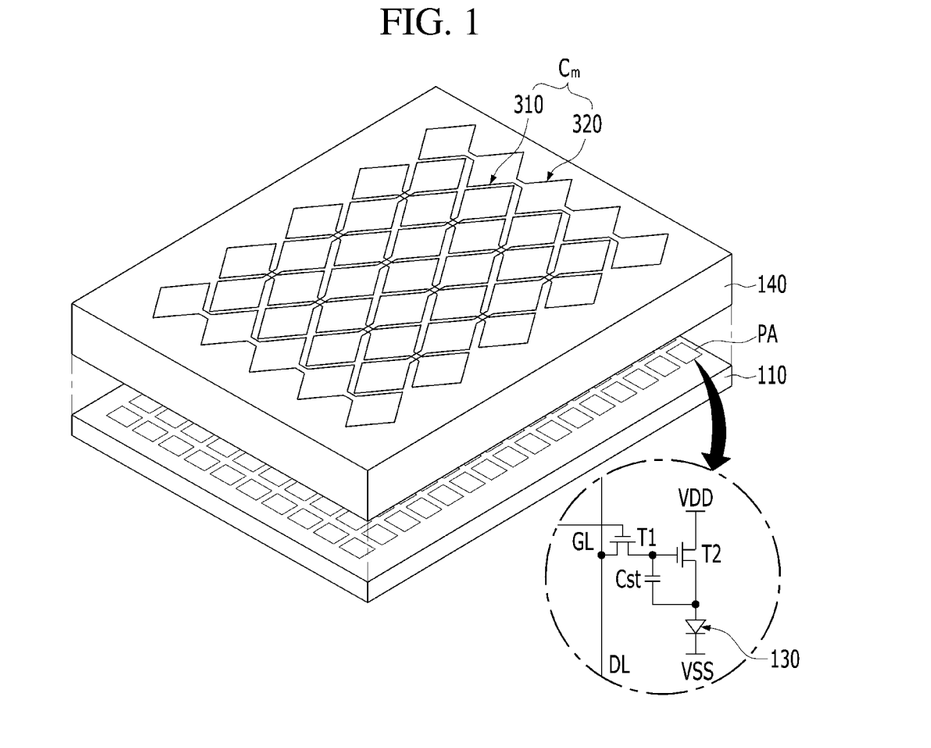
FIGS. 1 and 2 are views schematically showing a touch display apparatus according to an embodiment of the present disclosure.
Figure 2:
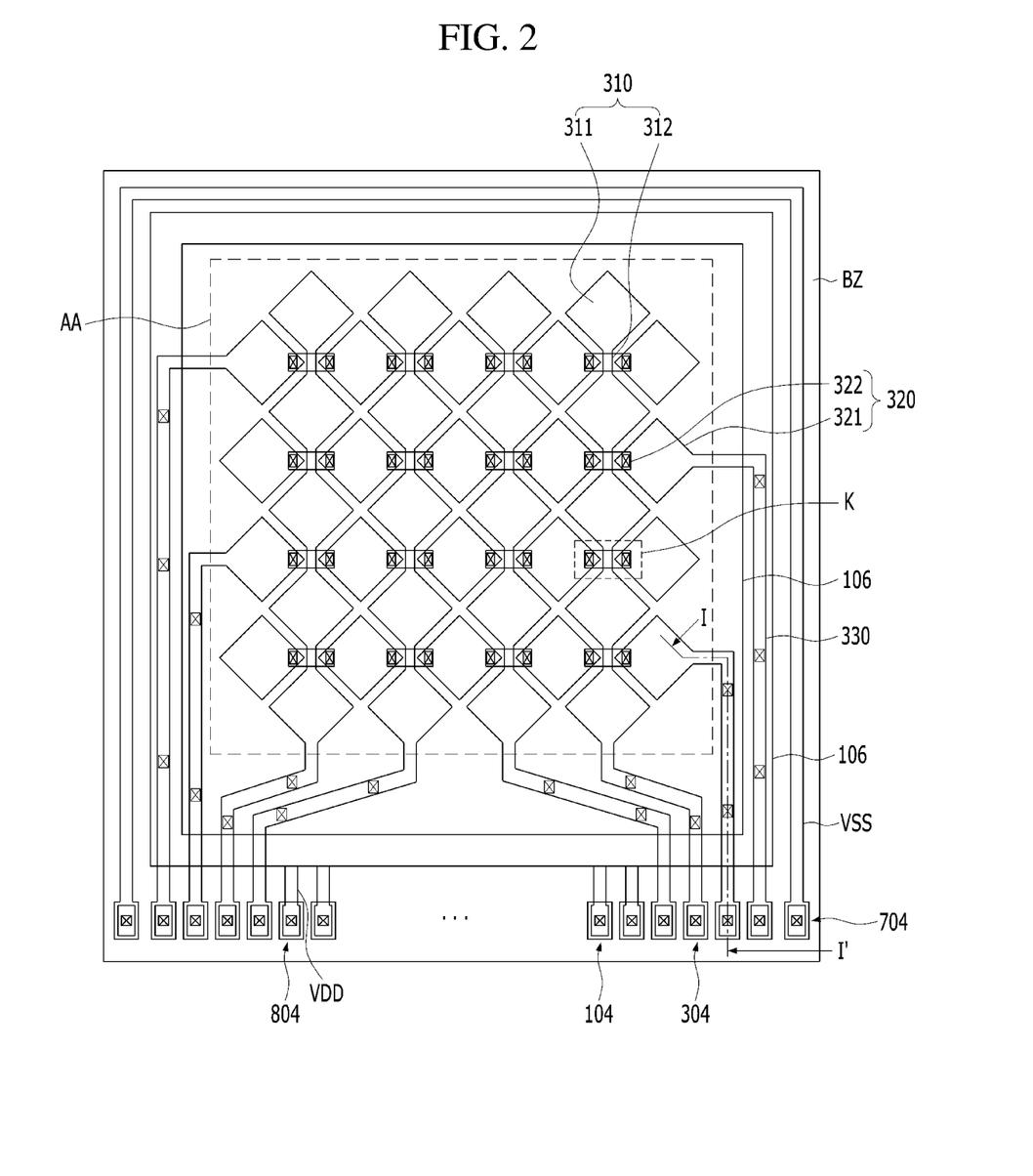
Figure 3:
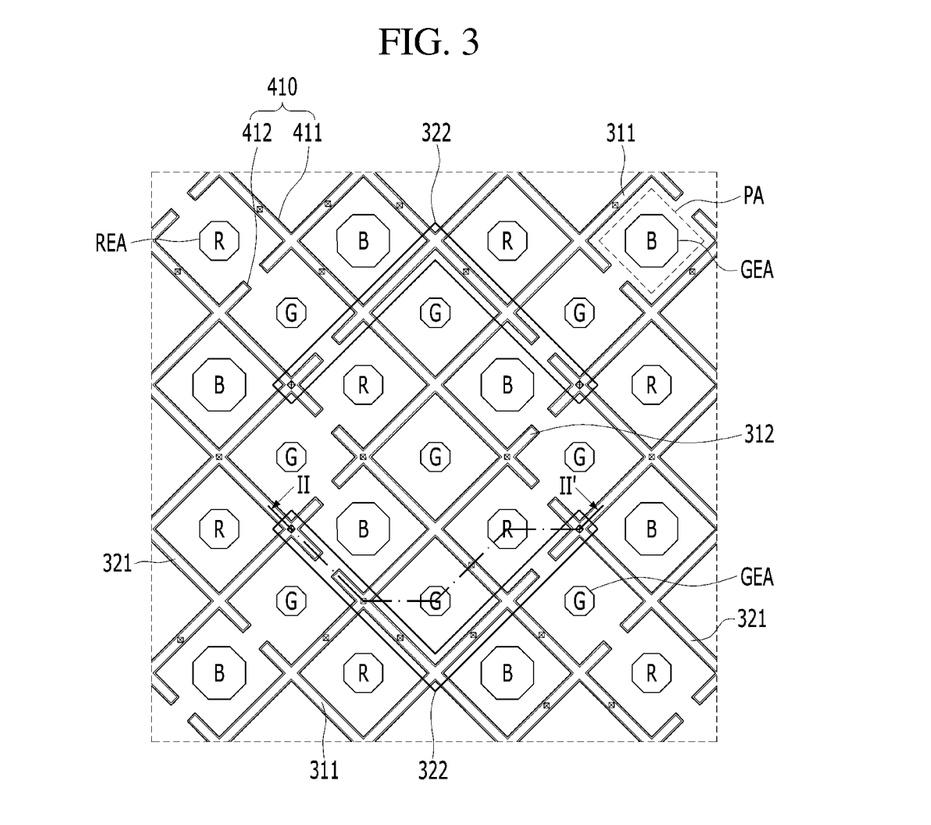
FIG. 3 is an enlarged view of K region in FIG. 2 according to an embodiment of the present disclosure.
Figure 4:
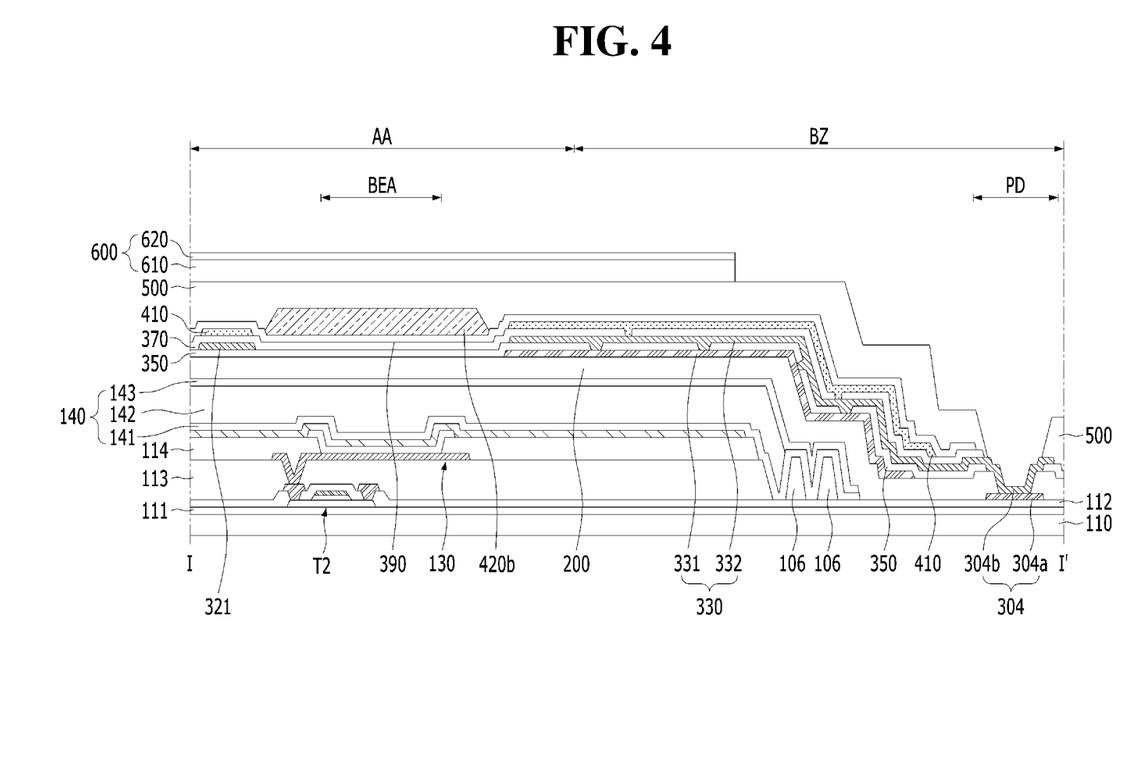
FIG. 4 is a view taken along I-I' of FIG. 2 according to an embodiment of the present disclosure.
Figure 5:
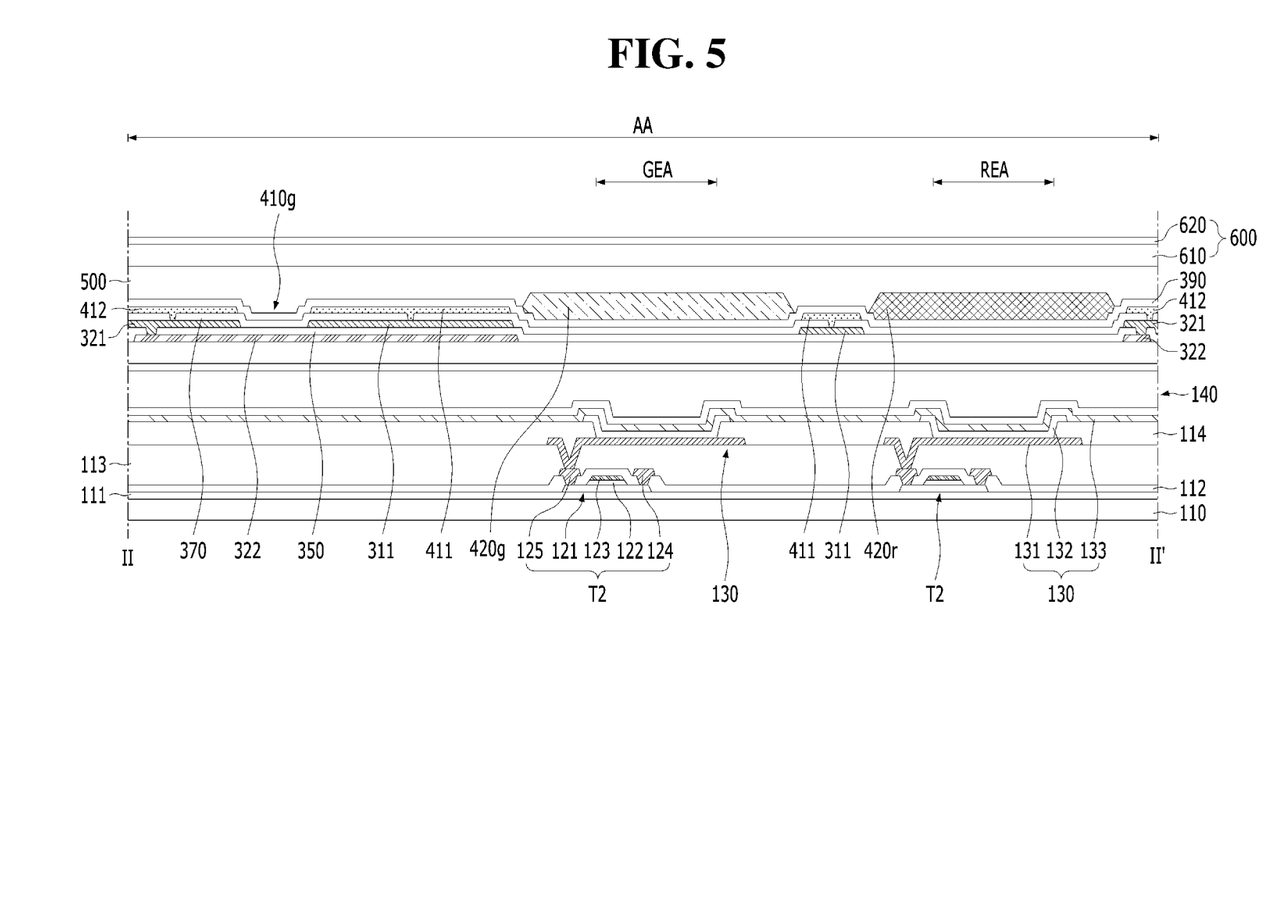
FIG. 5 is a view taken along II-II' of FIG. 3 according to an embodiment of the present disclosure.

FIGS. 1 and 2 are views schematically showing a touch display apparatus according to an embodiment of the present disclosure. FIG. 3 is an enlarged view of K region in FIG. 2 according to an embodiment of the present disclosure. FIG. 4 is a view taken along I-I' of FIG. 2 according to an embodiment of the present disclosure. FIG. 5 is a view taken along II-II' of FIG. 3 according to an embodiment of the present disclosure.

Referring to FIGS. 1 to 5, the touch display apparatus according to the embodiment of the present disclosure may include a device substrate 110. The device substrate 110 may include an insulating material. For example, the device substrate 110 may include glass or plastic. The device substrate 110 may include a display area AA and a bezel area BZ disposed outside the display area AA. For example, the bezel area BZ may surround the display area AA.

The display area AA of the device substrate 110 may display an image provided to user. For example, a plurality of pixel area PA may be disposed in the display area AA of the device substrate 110. The pixel areas PA may be disposed side by side in a first direction and a second direction that is perpendicular to the first direction. Two pixel areas PA adjacent in the first direction may be alternately disposed. Two pixel areas PA adjacent in the second direction may be alternately disposed. Each of the pixel areas PA may realize a color different from adjacent pixel areas PA. The touch display apparatus according to the embodiment of the present disclosure may have a pen-tile structure. For example, in the display area AA, the pixel areas PA may include first rows in which red pixel regions R and blue pixel regions B are alternately arranged and second rows in which green pixel regions G are arranged, wherein the first rows and the second rows are alternately disposed.

Light displaying a specific color may be emitted from each pixel area PA. For example, a pixel driving circuit and a light-emitting device 130 being electrically connected to the pixel driving circuit may be disposed in each pixel area PA.

The pixel driving circuit may be connected one gate line of gate lines GL applying a gate signal and one data line of data lines DL applying a data signal. For example, the pixel driving circuit may generate a driving current corresponding to the data signal according to the gate signal. The driving current generated by the pixel driving circuit may provide the light-emitting device 130 for one frame. For example, the pixel driving circuit may include a switching thin film transistor T1, a driving thin film transistor T2, and a storage capacitor Cst.

The switching thin film transistor T1 may transmit the data signal to the driving thin film transistor T2 according to the gate signal. The driving thin film transistor T2 may generate the driving current. For example, the driving thin film transistor T2 may include a semiconductor pattern 121, a gate insulating layer 122, a gate electrode 123, a source electrode 124 and a drain electrode 125.

The semiconductor pattern 121 may include a semiconductor material. For example, the semiconductor pattern 121 may include at least one of amorphous silicon, polycrystalline silicon and oxide semiconductor. The semiconductor pattern 121 may include a source region, a drain region, and a channel region. The channel region may be disposed between the source region and the drain region. The source region and the drain region may have a resistance lower than the channel region. For example, the source region and the drain region may include a conductorized region of oxide semiconductor.

The gate insulating layer 122 may be disposed on the semiconductor pattern 121. For example, the gate insulating layer 122 may overlap the channel region of the semiconductor pattern 121. The source region and the drain region of the semiconductor pattern 121 may be disposed outside the gate insulating layer 122. The gate insulating layer 122 may include an insulating material. For example, the gate insulating layer 122 may include an inorganic insulating material, such as silicon oxide (SiO) and silicon nitride (SiN).

The gate electrode 123 may be disposed on the gate insulating layer 122. For example, the gate electrode 123 may overlap the channel region of the semiconductor pattern 121. The gate electrode 123 may be insulated from the semiconductor pattern 121 by the gate insulating layer 122. For example, a side surface of the gate insulating layer 122 may be continuous with a side surface of the gate electrode 123. The gate electrode 123 may include a conductive material. For example, the gate electrode 123 may include a metal, such as aluminum (Al), titanium (Ti), copper (Cu), molybdenum (Mo), tantalum (Ta), chrome (Cr) and tungsten (W). The channel region of the semiconductor pattern 121 may have an electric conductivity corresponding to a voltage applied to the gate electrode 123.

The source electrode 124 may include a conductive material. For example, the source electrode 124 may include a metal, such as aluminum (Al), titanium (Ti), copper (Cu), molybdenum (Mo), tantalum (Ta), chrome (Cr) and tungsten (W). The source electrode 124 may be insulated from the gate electrode 123. The source electrode 124 may be disposed on a layer different from the gate electrode 123. For example, an interlayer insulating layer 112 covering the gate electrode 123 may be disposed on the device substrate 110, and the source electrode 124 may be disposed on the interlayer insulating layer 112. The interlayer insulating layer 112 may include an insulating material. For example, the interlayer insulating layer 112 may include an inorganic insulating material, such as silicon oxide (SiO) and silicon nitride (SiN).

The source electrode 124 may be electrically connected to the source region of the semiconductor pattern 121. For example, the interlayer insulating layer 112 may include a source contact hole partially exposing the source region of the semiconductor pattern 121. The source electrode 124 may be in direct contact with the source region of the semiconductor pattern 121 through the source contact hole.

The drain electrode 125 may include a conductive material. For example, the drain electrode 125 may include a metal, such as aluminum (Al), titanium (Ti), copper (Cu), molybdenum (Mo), tantalum (Ta), chrome (Cr) and tungsten (W). The drain electrode 125 may be insulated from the gate electrode 123. The drain electrode 125 may be disposed on a layer different from the gate electrode 123. For example, the drain electrode 125 may be disposed on the interlayer insulating layer 112. The drain electrode 125 may be disposed on the same layer as the source electrode 124. The drain electrode 125 may include the same material as the source electrode 124. For example, the drain electrode 125 may be formed simultaneously with the source electrode 124.

The drain electrode 125 may be electrically connected to the drain region of the semiconductor pattern 121. For example, the interlayer insulating layer 112 may include a drain contact hole partially exposing the drain region of the semiconductor pattern 121. The drain electrode 125 may be in direct contact with the drain region of the semiconductor pattern 121 through the drain contact hole.

The switching thin film transistor T1 may have the same structure as the driving thin film transistor T2. For example, the switching thin film transistor T1 may include a gate electrode electrically connected to the corresponding gate line GL, a source electrode electrically connected to the corresponding data line DL, and a drain electrode electrically connected to the gate electrode 123 of the driving thin film transistor T2. The source electrode 124 of the driving thin film transistor T2 may be electrically connected to a first power voltage supply line VDD supplying a positive power voltage. The storage capacitor Cst may maintain a signal applied to the gate electrode 123 of the driving thin film transistor T2 for one frame. For example, the storage capacitor Cst may be connected between the gate electrode 123 and the drain electrode 125 of the driving thin film transistor T2.

The light-emitting device 130 may emit light using the driving current supplied from the pixel driving circuit. For example, the light-emitting device 130 may include a first emission electrode 131, a light-emitting stack 132 and a second emission electrode 133, which are sequentially stacked on the device substrate 110.

The first emission electrode 131 may be electrically connected to the drain electrode 125 of the driving thin film transistor T2. For example, the driving current generated by the pixel driving circuit may be supplied to the first emission electrode 131 of the light-emitting device 130. The first emission electrode 131 may include a conductive material. The first emission electrode 131 may include a material having a high reflectance. For example, the first emission electrode 131 may be a metal, such as aluminum (Al), titanium (Ti), copper (Cu), molybdenum (Mo), tantalum (Ta), chrome (Cr) and tungsten (W). The first emission electrode 131 may have a multi-layer structure. For example, the first emission electrode 131 may have a structure in which a reflective electrode made of a metal is disposed between transparent electrodes made of a transparent conductive material, such as ITO and IZO.

The light-emitting stack 132 may generate light having luminance corresponding to a voltage difference between the first emission electrode 131 and the second emission electrode 133. For example, the light-emitting stack 132 may include an emission material layer (EML) having an emission material. The emission material may include an organic material, an inorganic material or a hybrid material. For example, the touch display apparatus according to the embodiment of the present disclosure may be an organic light-emitting display apparatus including an organic emission material.

The light-emitting stack 132 may have a multi-layer structure. For example, the light-emitting stack 132 may further include at least one of a hole injection layer (HIL), a hole transport layer (HTL), an electron transport layer (ETL) and an electron injection layer (EIL). The light-emitting stack 132 may include a plurality of the emission material layer. For example, the light-emitting stack 132 may include a charge generation layer (CGL) between a first emission material layer and a second emission material layer. The second emission material layer may include a material different from the first emission material layer.

The second emission electrode 133 may include a conductive material. The second emission electrode 133 may have a transmittance higher than the first emission electrode 131. For example, the second emission electrode 133 may be a transparent electrode made of a transparent conductive material. The second emission electrode 133 may include a transparent conductive oxide material, such as ITO, IZO and AZO. Thus, in the touch display apparatus according to the embodiment of the present disclosure, the light generated by the light-emitting stack 132 of each pixel area PA may be emitted outside through the second emission electrode 133 of the corresponding pixel area PA.

A device buffer layer 111 may be disposed between the device substrate 110 and the pixel driving circuit of each pixel area PA. The device buffer layer 111 may prevent or at least reduce pollution due to the device substrate 110 in a process of forming the pixel driving circuits. The device buffer layer 111 may extend to the bezel area BZ of the device substrate 110. For example, an upper surface of the device substrate 110 toward the pixel driving circuit of each pixel area PA may be completely covered by the device buffer layer 111. The device buffer layer 111 may include an insulating material. For example, the device buffer layer 111 may include an inorganic insulating material, such as silicon oxide (SiO) and silicon nitride (SiN). The device buffer layer 111 may include a multi-layer structure. For example, the device buffer layer 111 may have a stacked structure of an inorganic insulating layer made of silicon oxide (SiO) and an inorganic insulating layer made of silicon nitride (SiN).

A planarization layer 113 may be disposed between the pixel driving circuit and the light-emitting device 130 of each pixel area PA. The planarization layer 113 may remove a thickness difference due to the pixel driving circuit of each pixel area PA. For example, an upper surface of the planarization layer 113 opposite to the device substrate 110 may be a flat surface. The switching thin film transistor T1, the driving thin film transistor T2 and the storage capacitor Cst in each pixel area PA may be covered by the planarization layer 113. The planarization layer 113 may include an insulating material. The planarization layer 113 may include a material different from the interlayer insulating layer 112. For example, the planarization layer 113 may include an organic insulating material.

The first emission electrode 131 of each pixel area PA may penetrate the planarization layer 113 to be electrically connected to the pixel driving circuit of the corresponding pixel area PA. For example, the planarization layer 113 may include pixel contact holes partially exposing the drain electrode 125 of the driving thin film transistor T2 in each pixel area PA. The first emission electrode 131 of each pixel area PA may be in direct contact with the drain electrode 125 of the driving thin film transistor T2 in the corresponding pixel area PA through one of the pixel contact holes.

The first emission electrode 131 of each pixel area PA may be insulated from the first emission electrode 131 of adjacent pixel area PA. The first emission electrode 131 of each pixel area PA may be spaced away from the first emission electrode 131 of adjacent pixel area PA. For example, a bank insulating layer 114 may be disposed between the first emission electrodes 131 of adjacent pixel areas PA. The bank insulating layer 114 may include an insulating material. For example, the bank insulating layer 114 may include an organic insulating material. The bank insulating layer 114 may cover an edge of the first emission electrode 131 in each pixel area PA. The light-emitting stack 132 and the second emission electrode 133 of each pixel area PA may be stacked on a portion of the corresponding first emission electrode 131 exposed by the bank insulating layer 114. For example, the bank insulating layer 114 may define an emission area BEA, GEA and REA in each pixel area PA.

The light-emitting device 130 of each pixel area PA may have the same structure as the light-emitting device 130 of an adjacent pixel area PA. For example, the light-emitting stack 132 of each pixel area PA may extend along a surface of the bank insulating layer 114 to be connected to the light-emitting stack 132 of each pixel area PA. The light emitted from the light-emitting device 130 of each pixel area PA may display the same color as the light emitted from the light-emitting device 130 of adjacent pixel area PA. For example, the light-emitting stack 132 of each pixel area PA may emit white light. The light-emitting stack 132 of each pixel area PA may be formed simultaneously with the light-emitting stack 132 of adjacent pixel area PA. Thus, in the touch display apparatus according to the embodiment of the present disclosure, a process of forming the light-emitting stack 132 on each pixel area PA may be simplified.

A voltage applied to the second emission electrode 133 of each pixel area PA may be the same as a voltage applied to the second emission electrode 133 of an adjacent pixel area PA. For example, the second emission electrode 133 of each pixel area PA may be electrically connected to a second power voltage supply line VSS supplying a negative power voltage. Thus, in the touch display apparatus according to the embodiment of the present disclosure, the luminance of the light emitted from the light-emitting device 130 of each pixel area PA may be adjusted by the data signal applied to the corresponding pixel area PA. The second emission electrode 133 of each pixel area PA may be electrically connected to the second emission electrode 133 of adjacent pixel area PA. For example, the second emission electrode 133 of each pixel area PA may be in direct contact with the second emission electrode 133 of adjacent pixel area PA. The second emission electrode 133 of each pixel area PA may be formed simultaneously with the second emission electrode 133 of adjacent pixel area PA. Therefore, in the touch display apparatus according to the embodiment of the present disclosure, a process of forming the second emission electrode 133 on each pixel area PA may be simplified.

An encapsulating unit 140 may be disposed on the light-emitting device 130 of each pixel area PA. The encapsulating unit 140 may prevent or at least reduce the damage of the light-emitting devices 130 due to external moisture and/or oxygen. The light-emitting device of each pixel area PA may be completely covered by the encapsulating unit 140. For example, the encapsulating unit 140 may extend on the bezel area BZ of the device substrate 110.

The encapsulating unit 140 (e.g., an encapsulation layer) may include a plurality of encapsulating layers including at least one inorganic encapsulating layer 141 and 143, and at least one organic encapsulating layer 142. For example, the encapsulating unit 140 may have a structure in which at least one organic encapsulating layer 142 is disposed between inorganic encapsulating layers 141 and 143. The uppermost layer of the encapsulating unit 140 may be the inorganic encapsulating layer 141 and 143. For example, an upper surface and a side surface of the organic encapsulating layer 142 may be covered by the inorganic encapsulating layer 141 and 143. Thus, in the touch display apparatus according to the embodiment of the present disclosure, the penetration of the external moisture and oxygen may be effectively blocked or at least reduced.

The inorganic encapsulating layers 141 and 143 may include an inorganic insulating material. For example, the inorganic encapsulating layers 141 and 143 may include an inorganic insulating material capable of low-temperature deposition, such as silicon nitride (SiN), silicon oxide (SiO), silicon oxynitride (SiON) and aluminum oxide ($Al_2O_3$). Thus, in the touch display apparatus according to the embodiment of the present disclosure, the damage of the light-emitting stacks 132 due to a process of forming the inorganic encapsulating layer 141 and 143 may be prevented or at least reduced.

The organic encapsulating layer 142 may relieve the stress due to the inorganic encapsulating layer 141 and 143. For example, the organic encapsulating layer 142 may include an organic insulating material, such as acrylic resin, epoxy resin, polyimide, polyethylene and silicon oxycarbide (SiOC). A thickness difference due to the light-emitting devices 130 may be removed by the organic encapsulating layer 142. For example, an upper surface of the organic encapsulating layer 142 opposite to the device substrate 110 may be a flat surface.

The organic encapsulating layer 142 may be formed by inkjet process. For example, a dam 106 may be disposed on the bezel area BZ of the device substrate 110. The dam 106 may block the flow of the organic encapsulating layer 142. The dam 106 may extend along an edge of the display area AA. For example, in the touch display apparatus according to the embodiment of the present disclosure, the organic encapsulating layer 142 may be formed in a region defined by the dam 106. The dam 106 may be formed using a process of forming at least one of insulating layers, which are disposed between the device substrate 110 and the encapsulating unit 140. For example, the dam 106 may be formed simultaneously with the planarization layer 113. The dam 106 may include the same material as the planarization layer 113. For example, the dam 106 may include an organic insulating material. The interlayer insulating layer 112 may extend on the bezel area BZ of the device substrate 110. For example, the dam 106 may be disposed on the interlayer insulating layer 112. A thickness of the dam 106 may be the same as a thickness of the planarization layer 113.

A touch sensor Cm may be disposed on the encapsulating unit 140. The touch sensor Cm may sense a touch of user and/or a tool. For example, the touch sensor Cm may sense the presence or absence of a touch and a touch position by a change of the mutual capacitance. The touch sensor Cm may include a first touch line 310 and a second touch line 320.

A touch driving signal may be applied to the first touch line. For example, the first touch line 310 (e.g., a first touch electrode line) may function as a touch driving line. The first touch line 310 may include first touch electrodes 311 and first bridge electrodes 312. The first touch electrodes 311 may be disposed side by side on the encapsulating unit 140 along a first direction. The first bridge electrodes 312 may electrically connect the first touch electrodes 311. Each of the first bridge electrodes 312 may extend in the first direction. For example, each of the first touch electrodes 311 may be connected to the adjacent first touch electrode 311 in the first direction by one of the first bridge electrodes 312.

The first touch electrodes 311 may include a conductive material. The first touch electrodes 311 may include a material having a relatively low resistance. For example, the first touch electrodes 311 may include a metal, such as aluminum (Al), titanium (Ti), copper (Cu), molybdenum (Mo) and tantalum (Ta). Each of the first touch electrodes 311 may have a multi-layer structure. For example, the first touch electrodes 311 may have a three-layer structure, such as Ti/Al/Ti, MoTi/Cu/MoTi and Ti/Al/Mo.

The first bridge electrodes 312 may include a conductive material. The first bridge electrodes 312 may include a material having a relatively low resistance. For example, the first bridge electrodes 312 may include a metal, such as aluminum (Al), titanium (Ti), copper (Cu), molybdenum (Mo) and tantalum (Ta). The first bridge electrodes 312 may include the same material as the first touch electrodes 311. Each of the first bridge electrodes 312 may have a multi-layer structure. For example, the first bridge electrodes 312 may have a three-layer structure, such as Ti/Al/Ti, MoTi/Cu/MoTi and Ti/Al/Mo. The first bridge electrodes 312 may have the same structure as the first touch electrodes 311. The first bridge electrodes 312 may be disposed on the same layer as the first touch electrodes 311. For example, each of the first bridge electrodes 312 may be in direct contact with the corresponding first touch electrodes 311.

The second touch line 320 (e.g., a second touch electrode line) may include second touch electrodes 321 and second bridge electrodes 322. The second touch electrodes 321 may be disposed side by side on the encapsulating unit 140 along a second direction that is different from the first direction. The second touch electrodes 321 may be disposed on the same layer as the first touch electrodes 311. The second touch electrodes 321 may be insulated from the first touch electrodes 311. For example, the second touch electrodes 321 may be disposed between the first touch electrodes 311. The second touch electrodes 321 may have the same shape as the first touch electrodes 311. For example, the first touch electrodes 311 and the second touch electrodes 321 may be alternately arranged on the encapsulating unit 140. Thus, in the touch display apparatus according to the embodiment of the present disclosure, the charges charged by the touch driving signal may be discharged through the second touch line 320. For example, the second touch line 320 may function as a touch sensing line. Therefore, the touch display apparatus according to the embodiment of the present disclosure may sense the presence or absence of the touch of the user and/or the tool, and the touch position using the touch sensor Cm.

The second touch electrodes 321 may include a conductive material. The second touch electrodes 321 may include a material having a relatively low resistance. For example, the second touch electrodes 321 may include a metal, such as aluminum (Al), titanium (Ti), copper (Cu), molybdenum (Mo) and tantalum (Ta). The second touch electrodes 321 may include the same material as the first touch electrodes 311. Each of the second touch electrodes 321 may have a multi-layer structure. For example, the second touch electrodes 321 may have a three-layer structure, such as Ti/Al/Ti, MoTi/Cu/MoTi and Ti/Al/Mo. The second touch electrodes 321 may have the same structure as the first touch electrodes 311.

The second touch electrodes 321 may be disposed on the same layer as the first touch electrodes 311 and the first bridge electrodes 312. The second touch electrodes 321 may be insulated from the first bridge electrodes 312. The second touch electrodes 321 may be spaced away from the first bridge electrodes 312. For example, the first bridge electrodes 312 may cross between the second touch electrodes 321.

The second bridge electrodes 322 may electrically connect between the second touch electrodes 321. Each of the second bridge electrodes 322 may extend in the second direction. For example, each of the second touch electrodes 321 may be connected to the adjacent second touch electrodes 321 in the second direction by one of the second bridge electrodes 322. The second direction may be different from the first direction. For example, the second direction may be perpendicular to the first direction. The second bridge electrodes 322 may cross between the first touch electrodes 311. For example, each of the second bridge electrodes 322 may intersect one of the first bridge electrodes 312. The second bridge electrodes 322 may be insulated from the first bridge electrodes 312. The second bridge electrodes 322 may be disposed on a layer different from the first bridge electrodes 312. For example, the touch sensor Cm may include a touch insulating layer 350 on the second bridge electrodes 322, and the first touch electrodes 311, the first bridge electrodes 312 and the second touch electrodes 321 may be disposed on the touch insulating layer 350.

The touch insulating layer 350 may include an insulating material. For example, the touch insulating layer 350 may include an inorganic insulating material, such as silicon oxide (SiO) and silicon nitride (SiN). The touch insulating layer 350 may include touch contact holes partially exposing each second bridge electrode 322. Each of the second touch electrodes 321 may be connected to the corresponding second bridge electrode 322 through one of the touch contact holes.

The second bridge electrodes 322 may include a conductive material. The second bridge electrodes 322 may include a material having a relatively low resistance. For example, the second bridge electrodes 322 may include a metal, such as aluminum (Al), titanium (Ti), copper (Cu), molybdenum (Mo) and tantalum (Ta). Each of the second bridge electrodes 322 may have a multi-layer structure. For example, the second bridge electrodes 322 may have a three-layer structure, such as Ti/Al/Ti, MoTi/Cu/MoTi and Ti/Al/Mo.

The first touch electrodes 311, the first bridge electrodes 312, the second touch electrodes 321, and the second bridge electrodes 322 of the touch sensor Cm may be disposed in the display area AA. The emission areas BEA, GEA, and REA of each pixel area PA may be disposed between the first touch electrodes 311, the first bridge electrodes 312, the second touch electrodes 321, and the second bridge electrodes 322. The first touch line 310 and the second touch line 320 may be disposed outside the light-emitting devices 130. For example, the first touch electrodes 311, the first bridge electrodes 312, the second touch electrodes 321, and the second bridge electrodes 322 may overlap the bank insulating layer 114. In a plan view, each of the first touch electrodes 311 and each of the second touch electrodes 321 may have a mesh shape including openings overlapping with the emission area BEA, GEA and REA of each pixel area PA. Thus, in the touch display apparatus according to the embodiment of the present disclosure, the accuracy of the touch sensing using the touch sensor Cm may be improved, and the decrease in light extraction efficiency due to the first touch electrodes 311, the first bridge electrodes 312, the second touch electrodes 321 and the second bridge electrodes 322 of the touch sensor Cm may be minimized.

A touch buffer layer 200 may be disposed between the encapsulating unit 140 and the touch sensor Cm. For example, the second bridge electrodes 322 may be disposed between the touch buffer layer 200 and the touch insulating layer 350. The touch buffer layer 200 may reduce a parasitic capacitance generated between the second emission electrode 133 of each light-emitting device 130 and the touch sensor Cm. For example, a distance between the first touch line 310 of the touch sensor Cm and the second emission electrode 133 of each light-emitting device 130 and a distance between the second touch line 320 of the touch sensor Cm and the second emission electrode 133 of each light-emitting device 130 may be increased by the touch buffer layer 200. Thus, in the touch display apparatus according to the embodiment of the present disclosure, the accuracy of the touch sensing by the touch sensor Cm may be improved. The touch buffer layer 200 may include an insulating material. For example, the touch buffer layer 200 may include an inorganic insulating material, such as silicon oxide (SiO) and silicon nitride (SiN).

A touch passivation layer 370 may be disposed on the touch sensor Cm. The touch passivation layer 370 may prevent or at least reduce the damage of the touch sensor Cm due to the external impact and moisture. For example, the first touch electrodes 311, the first bridge electrodes 312, the second touch electrodes 321, and the second bridge electrodes 322 may be covered by the touch passivation layer 370. The touch passivation layer 370 may be in direct contact with the touch insulating layer 350 at the outside of the first touch line 310 and the second touch line 320. The touch passivation layer 370 may include an insulating material. For example, the touch passivation layer 370 may include an organic insulating material.

A light-blocking pattern 410 may be disposed on the touch passivation layer 370. In one embodiment, the light-blocking pattern 410 is patterned to be non-overlapping with the emission areas. The light-blocking pattern 410 may have a reflectance that is less than reflectances of the first touch electrodes 311, the first bridge electrodes 312 and the second touch electrodes 321. Therefore, the light-blocking pattern 410 is less reflective than the first touch electrodes 311, the first bridge electrodes 312 and the second touch electrodes 321. Thus, in the touch display apparatus according to the embodiment of the present disclosure, the reflection of external light by the first touch electrodes 311, the first bridge electrodes 312 and the second touch electrodes 321 may be reduced by the light-blocking pattern 410. Therefore, in the touch display apparatus according to the embodiment of the present disclosure, the deterioration of the image due to the reflection of the external light may be reduced.

The light-blocking pattern 410 may include a conductive material. The light-blocking pattern 410 may include a metal having a relative low reflectance, such as molybdenum (Mo), titanium (Ti), tungsten (W) and copper (Cu). For example, the light-blocking pattern 410 may be formed of one of MoTi, MoO, Ti, TiO, CuSi, and MoW. The light-blocking pattern 410 may be electrically connected to the first touch electrodes 311 and the second touch electrodes 321. For example, the light-blocking pattern 410 may comprise of a first light-blocking pattern 411 electrically connected to the first touch electrodes 311 and the first bridge electrodes 312, and a second light-blocking pattern 412 electrically connected to the second touch electrodes 321. The second light-blocking pattern 412 may include the same material as the first light-blocking pattern 411. The second light-blocking pattern 412 may be disposed on the same layer as the first light-blocking pattern 411. For example, the second light-blocking pattern 412 may be formed simultaneously with the first light-blocking pattern 411. Thus, in the touch display apparatus according to the embodiment of the present disclosure, the resistance of the first touch line 310 and the second touch line 320 may be reduced. Therefore, in the touch display apparatus according to the embodiment of the present disclosure, the reliability for the touch sensing may be improved.

The first light-blocking pattern 411 may be disposed on the first touch electrodes 311 and the first bridge electrodes 312, but not the second touch electrodes 321 and the second bridges 322. In one embodiment, the first light-blocking pattern overlaps the first touch electrodes 311 and the first bridge electrodes 312. For example, a planar shape of the first light-blocking pattern 411 may be the same as a planar shape of the first touch electrodes 311 and the first bridge electrodes 312. That is, an outer periphery of a first portion of the first light-blocking pattern 411 may be aligned with an outer periphery of the first touch electrodes 311 and an outer periphery of a second portion of the first light-blocking pattern 411 may be aligned with an outer periphery of the first bridge electrodes 312. In a plane view, the first light-blocking pattern 411 may have a mesh shape. The second light-blocking pattern 412 may be disposed on the second touch electrodes 321. In one embodiment, the second light-blocking pattern 412 overlaps the second touch electrodes 321. For example, a planar shape of the second light-blocking pattern 412 may be the same as a planar shape of the second touch electrodes 321. That is, an outer periphery of the second light-blocking pattern 412 may be aligned with an outer periphery of the second touch electrodes 321 but is not aligned with an outer periphery of the second bridge electrodes 322. In a plane view, the second light-blocking pattern 412 may have a mesh shape. The second light-blocking pattern 412 may be spaced away from the first light-blocking pattern 411. For example, the light-blocking pattern 410 may include a gap 410g overlapping with a spaced region between the first touch electrodes 311 and the second touch electrodes 321.

The first light-blocking pattern 411 and the second light-blocking pattern 412 may be disposed outside the light-emitting devices 130. That is, the first light-blocking pattern 411 and the second light-blocking pattern 412 are non-overlapping with the light-emitting devices 130. For example, the first light-blocking pattern 411 and the second light-blocking pattern 412 may extend between the emission areas BEA, GEA and REA, but are non-overlapping with the emission areas BEA, GEA and REA. Thus, in the touch display apparatus according to the embodiment of the present disclosure, an area of the emission areas BEA, GEA, and REA may be not affected by the light-blocking pattern 410. Therefore, in the touch display apparatus according to the embodiment of the present disclosure, the resistance of the first touch line 310 and the second touch line 320 may be reduced, without reducing the area of the emission areas BEA, GEA and REA.

An upper passivation layer 390 may be disposed on the light-blocking pattern 410. The upper passivation layer 390 may prevent or at least reduce the damage of the light-blocking pattern 410 due to the external impact and moisture. The upper passivation layer 390 may include an insulating material. For example, the upper passivation layer 390 may include an inorganic insulating material, such as silicon oxide (SiO) and silicon nitride (SiN). The upper passivation layer 390 may extend beyond the light-blocking pattern 410. For example, the upper passivation layer 390 may be in direct contact with the touch passivation layer 370 at the outside of the light-blocking pattern 410.

Color filters 420b, 420g and 420r may be disposed on the upper passivation layer 390. The color filters 420b, 420g and 420r may respectively overlap the emission areas BEA, GEA, and REA. Each of the light-emitting devices 130 may overlap one of the color filters 420b, 420g and 420r. For example, the light generated by each light-emitting device 130 may be emitted outside through one of the color filters 420b, 420g and 420r. Each of the color filters 420b, 420g and 420r may include a material different from the adjacent color filter 420b, 420g and 420r. For example, blue color filters 420b may be disposed on blue emission areas BEA of blue pixel areas B, green color filters 420g may be disposed on green emission areas GEA of green pixel areas G, and red color filters 420r may be disposed on red emission areas REA of red pixel areas R. Thus, the touch display apparatus according to the embodiment of the present disclosure may provide an image made of various color to the user using the color filters 420b, 420g and 420r, and the white light emitted from the light-emitting device 130 of each pixel area PA.

The color filters 420b, 420g and 420r may be disposed in the opening of the first touch line 310 having a mesh shape, and the opening of the second touch line 320 having a mesh shape. For example, the light-blocking pattern 410 may surround the color filters 420b, 420g and 420r. Thus, in the touch display apparatus according to the embodiment of the present disclosure, the external light being that is not blocked by the light-blocking pattern 410 may be irradiated onto the light-emitting devices 130 by passing through one of the color filters 420b, 420g and 420r. And, in the touch display apparatus according to the embodiment of the present disclosure, the external light reflected by the first emission electrode 131 of each light-emitting device 130 may be emitted outside by passing through the color filter 420b, 420g and 420r overlapping with the corresponding light-emitting device 130. That is, in the touch display apparatus according to the embodiment of the present disclosure, the external light reflected by the first emission electrode 131 of each light-emitting device 130 may realize the same color as the light emitted from the corresponding light-emitting device 130. Therefore, in the touch display apparatus according to the embodiment of the present disclosure, the deterioration of the image due to the reflection of the external light may be prevented, without the use of a polarizer.

A device passivation layer 500 may be disposed on the color filters 420b, 420g and 420r. The device passivation layer 500 may prevent the damage of the color filters 420b, 420g and 420r due to the external impact and moisture. The device passivation layer 500 may extend beyond the display area AA. For example, the color filters 420b, 42g and 420r may be completely covered by the device passivation layer 500. The device passivation layer 500 may include an insulating material. The device passivation layer 500 may include a material different from the upper passivation layer 390. For example, the device passivation layer 500 may include an organic insulating material. A thickness difference by the first touch line 310, the second touch line 320, the light-blocking pattern 410 and the color filters 420b, 420g and 420r may be removed by the device passivation layer 500.

A cover element 600 may be disposed on the device passivation layer 500. The cover element 600 may prevent or at least reduce the damage due to the external impact. The cover element 600 may be in direct contact with the device passivation layer 500. For example, the cover element 600 may include a cover adhesive layer 610 and a cover window 620.

The cover adhesive layer 610 may include an adhesive material. The cover adhesive layer 610 may include a transparent material. For example, the cover adhesive layer 610 may include an optical clear adhesive (OCA). The cover adhesive layer 610 may relieve the reflection of the external light. For example, the cover adhesive layer 610 may include a dye.

The cover window 620 may be attached on the device passivation layer 500 by the cover adhesive layer 610. The cover window 620 may include a transparent material. The cover window 620 may have hardness greater than or equal to a specific level. For example, the cover window 620 may include glass or plastic.

Various signals to realize the image may be applied to each pixel area PA through the bezel area BZ of the device substrate 110. For example, the bezel area BZ of the device substrate 110 may include a pad area PD in which display pads 104 and touch pads 304 are disposed. The dam 106 may be disposed between the display area AA and the pad area PD. For example, the display pads 104 and the touch pads 304 may be spaced away from the encapsulating unit 140. Thus, in the touch display apparatus according to the embodiment of the present disclosure, it is possible to prevent some of the display pads 104 and the touch pads 304 from being unintentionally covered by the organic encapsulation layer 142. Therefore, in the touch display apparatus according to the embodiment of the present disclosure, the distortion of the signal transmitted through the display pads 104 and the touch pads 304 may be prevented.

The gate lines GL and/or the data lines DL may be electrically connected to the display pads 104. For example, the data signal applied to each pixel area PA may be transmitted through one of the display pads 104 and one of the data lines DL. The touch pads 304 may be disposed side by side with the display pads 104. For example, the pad area PD may be disposed on a side of the display area AA.

Each of the touch pads 304 may include a lower pad electrode 304a and an upper pad electrode 304b on the lower pad electrode 304a. The touch pads 304 may be formed using a process of forming the pixel driving circuits, the light-emitting devices 130 and the touch sensor Cm. For example, the lower pad electrode 304a may include the same material as the source electrode 124 and the drain electrode 125 of each pixel driving circuit, and the upper pad electrode 304b may include the same material as the first touch electrodes 311, the first bridge electrodes 312 and the second touch electrodes 321. The display pads 104 may have the same structure as the touch pads 304. For example, each of the display pads 104 may include a lower pad electrode and an upper pad electrode on the lower pad electrode. The lower pad electrode of each display pad 104 may include the same material as the lower pad electrode 304a of each touch pad 304, and the upper pad electrode of each display pad 104 may include the same material as the upper pad electrode 304b of each touch pad 304. For example, the display pads 104 may be formed simultaneously with the touch pads 304.

The touch pads 304 may be electrically connected to the first touch line 310 and the second touch line 320 by touch routing lines 330. For example, the touch driving signal may be applied to the first touch line 310 through one of the touch pads 304 and one of the touch routing lines 330, and the charges charged by touch driving signal may be discharged through the second touch line 320, one of the touch routing lines 330 and one of the touch pads 304.

The touch routing lines 330 may be formed using a process of forming the touch sensor Cm. For example, each of the touch routing lines 330 may have a stacked structure of a lower routing line 331 including the same material as the second bridge electrodes 322, and an upper routing line 332 including the same material as the first bridge electrodes 312. The upper routing line 332 of each touch routing line 330 may be electrically connected to the lower routing line 331 of the corresponding touch routing line 330. For example, the touch insulating layer 350 may include routing contact holes partially exposing the lower routing line 331 of each touch routing line 330. The upper routing line 332 of each touch routing line 330 may be in direct contact with the lower routing line 331 of the corresponding touch routing line 330 through the routing contact holes. Thus, in the touch display apparatus according to the embodiment of the present disclosure, the first touch line 310 and the second touch line 320 may be stably connected to the corresponding touch pad 304 by the touch routing lines 330. And, in the touch display apparatus according to the embodiment of the present disclosure, a resistance of each touch routing line 330 may be reduced. Therefore, in the touch display apparatus according to the embodiment of the present disclosure, a signal delay due to the touch routing lines 330 may be reduced.

The light-blocking pattern 410 may extend along the touch routing lines 330. That is, the light-blocking pattern 410 may overlap the touch routing lines 330. For example, the first light-blocking pattern 411 may extend along the touch routing line 330 that is electrically connected to the first touch line 310, and the second light-blocking pattern 412 may extend along the touch routing line 330 that is electrically connected to the second touch line 320. The light-blocking pattern 410 may be disposed on the touch routing lines 330. For example, a planar shape of the light-blocking pattern 410 may be the same as a planar shape of the touch routing lines 330 between the display area AA and the pad area PD. Thus, in the touch display apparatus according to the embodiment of the present disclosure, the reflection of the external light between the display area AA and the pad area PD may be blocked by the light-blocking pattern 410.

The touch passivation layer 370 may cover the touch routing lines 330. The light-blocking pattern 410 may be electrically connected to the touch routing lines 330. For example, each of the first light-blocking pattern 411 and the second light-blocking pattern 412 may penetrate a portion of the touch passivation layer 370 to be electrically connected to the corresponding touch routing line 330. Thus, in the touch display apparatus according to the embodiment of the present disclosure, the resistance of each touch routing line 330 may be significantly reduced. Therefore, in the touch display apparatus according to the embodiment of the present disclosure, a signal delay due to the touch routing lines 330 may be prevented.

The device buffer layer 111, the interlayer insulating layer 112, the touch buffer layer 200, the touch insulating layer 350, the touch passivation layer 370, the upper passivation layer 390 and the device passivation layer 500 may extend on the pad area PD of the device substrate 110. For example, the lower pad electrode 304a of each touch pad 304 may be disposed on the interlayer insulating layer 112, and the upper pad electrode 304b of each touch pad 304 may penetrate the touch buffer layer 200 and the touch insulating layer 350 to be electrically connected to the lower pad electrode 304a of the corresponding touch pad 304. The touch passivation layer 370, the upper passivation layer 390 and the device passivation layer 500 may partially expose the upper pad electrode 304b of each touch pad 304.

A first power pads 704 being electrically connected to the second power voltage supply line VSS supplying a negative power voltage to each pixel area PA and a second power pads 804 being electrically connected to the first power voltage supply line VDD supplying a positive power voltage to each pixel area PA may be disposed on the pad area PD. The second power voltage supply line VSS may extend along an edge of the display area AA. For example, the second power voltage supply line VSS may be disposed outside the touch routing lines 330. Thus, in the touch display apparatus according to the embodiment of the present disclosure, a noise due to external signal may be blocked by the second power voltage supply line VSS. The first power voltage supply line VDD may extend parallel to signal lines electrically connected to the display pads 104.

Accordingly, the touch display apparatus according to the embodiment of the present disclosure may include the light-blocking pattern 410 on the touch passivation layer 370 covering the touch sensor Cm, wherein the light-blocking pattern 410 having a low-reflective metal may include the first light-blocking pattern 411 electrically connected to the first touch electrodes 311 and the first bridge electrodes 312 of the touch sensor Cm, and the second light-blocking pattern 412 electrically connected to the second touch electrodes 321 of the touch sensor Cm. Thus, in the touch display apparatus according to the embodiment of the present disclosure, the resistance of the first touch line 310 and the second touch line 320 may be reduced by the light-blocking pattern 410. Therefore, in the touch display apparatus according to the embodiment of the present disclosure, the reflection of the external light may be reduced, and the reliability of the touch sensing and the quality of realized image may be improved, without reducing an area of the emission areas BEA, GEA and REA.

Figure 6:
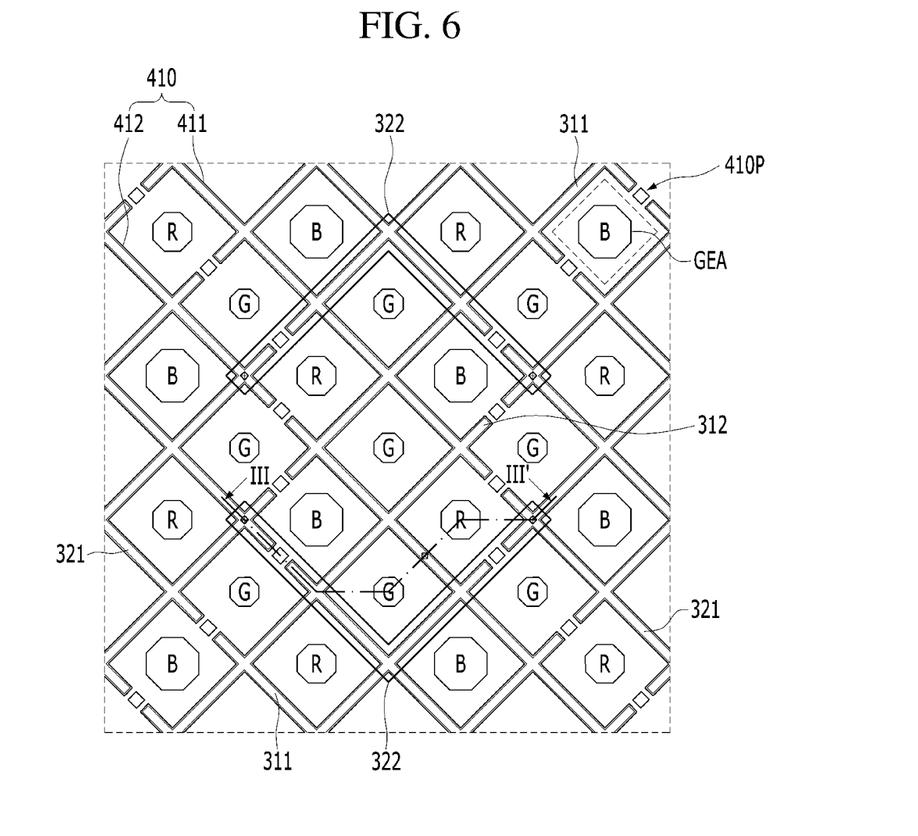
FIGS. 6 to 9 are views showing the touch display apparatus according to another embodiment of the present disclosure.
Figure 7:
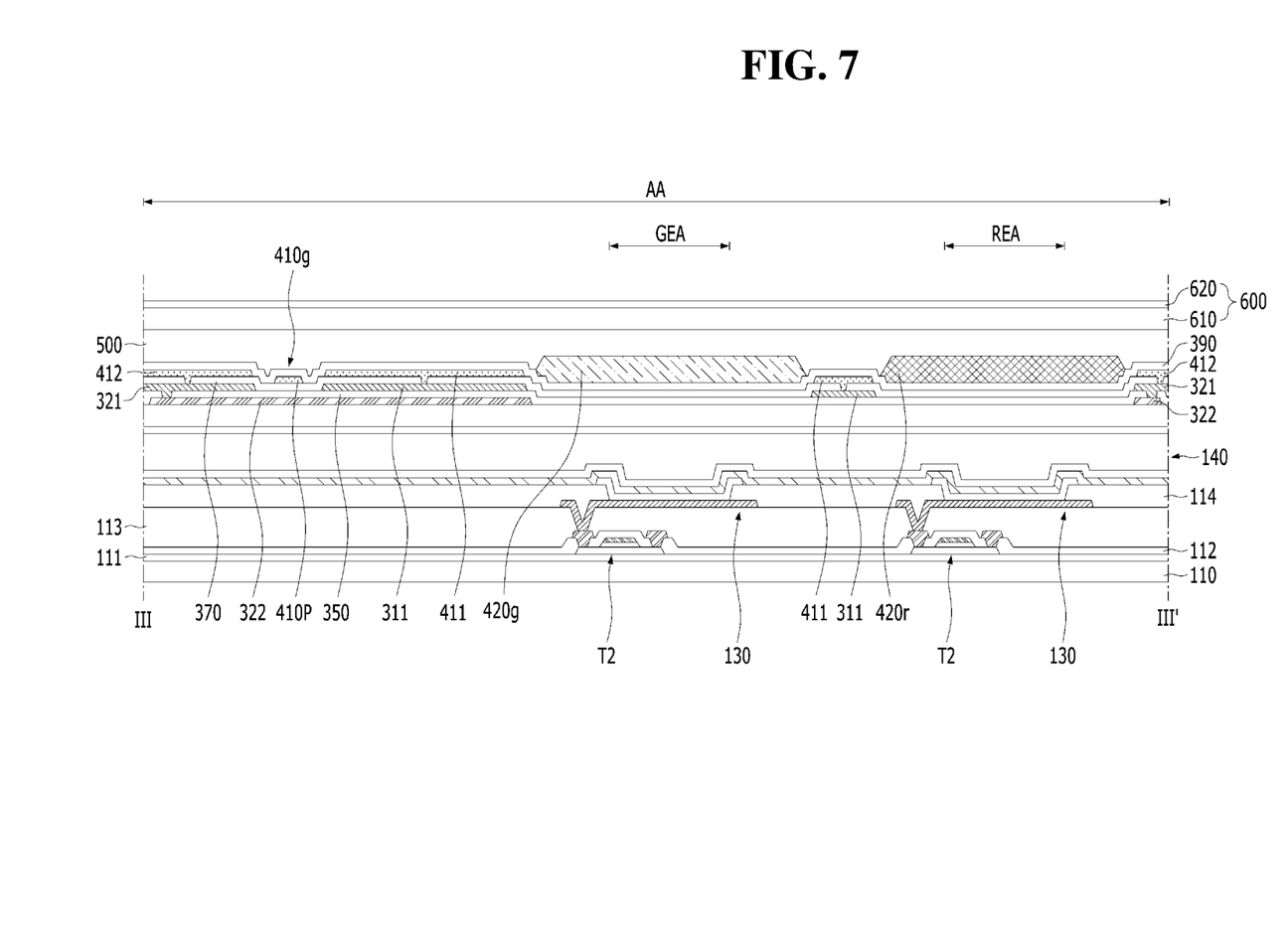

The touch display apparatus according to the embodiment of the present disclosure is described that a spaced area between the first light-blocking pattern 411 and the second light-blocking pattern 412 is filled by the upper passivation layer 390. However, the touch display apparatus according to another embodiment of the present disclosure may include a dummy pattern 410*p* disposed between the first light-blocking pattern 411 and the second light-blocking pattern 412, as shown in FIGS. 6 and 7. The dummy pattern 410*p* may include a material having a relative low reflectance. The dummy pattern 410*p* may be formed using a process of forming the light-blocking pattern 410. For example, the dummy pattern 410*p* may include the same material as the first light-blocking pattern 411 and the second light-blocking pattern 412. The dummy pattern 410*p* may be formed simultaneously with the first light-blocking pattern 411 and the second light-blocking pattern 412. For example, the dummy pattern 410*p* may be disposed on the same layer as the first light-blocking pattern 411 and the second light-blocking pattern 412. Thus, in the touch display apparatus according to another embodiment of the present disclosure, a light leakage due to a gap 410*g* between the first light-blocking pattern 411 and the second light-blocking pattern 412 may be prevented or at least reduced.

Figure 8:
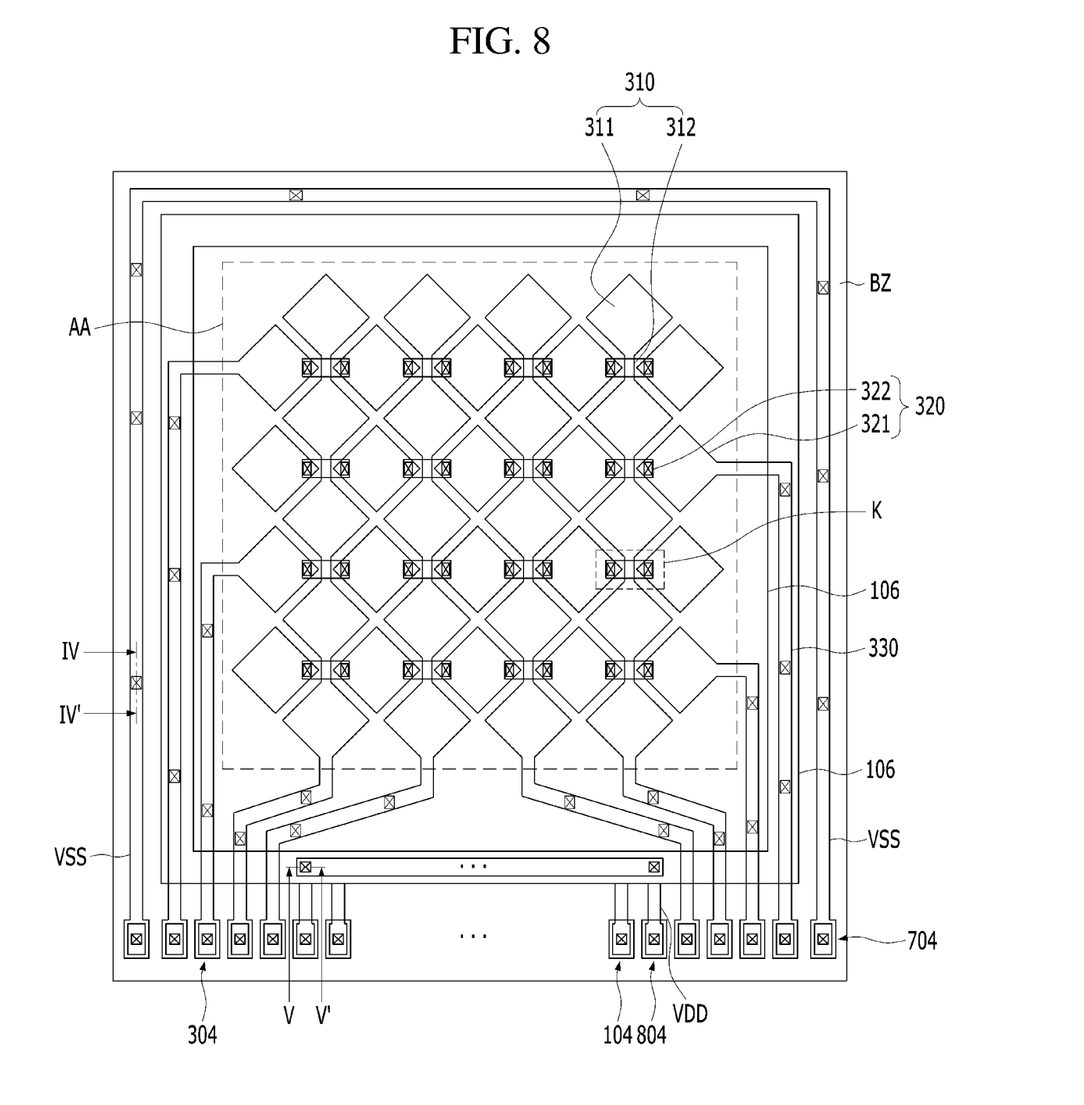
Figure 9:
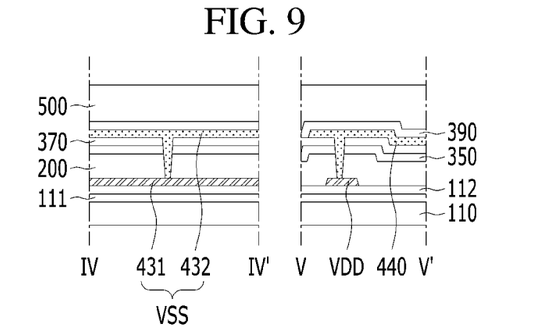

In the touch display apparatus according to another embodiment of the preset disclosure, the second power voltage supply line VSS may have a multi-layer structure. For example, in the touch display apparatus according to another embodiment of the preset disclosure, the second power voltage supply line VSS may include a first lower supply line 431 and a first upper supply line 432, as shown in FIGS. 8 and 9. The first upper supply line 432 may be disposed on the first lower supply line 431. The first lower supply line 431 may be formed using a process of forming the pixel driving circuit and the light-emitting device 130 of each pixel area PA. For example, the first lower supply line 431 may be formed simultaneously with the source electrode 124 and the drain electrode 125. The first lower supply line 431 may be disposed on the same layer as the source electrode 124 and the drain electrode 125. For example, the first lower supply line 431 may be disposed between the interlayer insulating layer 112 and the touch buffer layer 200. The first lower supply line 431 may include the same material as the source electrode 124 and the drain electrode 125. The first upper supply line 432 may be formed simultaneously with the light-blocking pattern 410. For example, the first upper supply line 432 may include the same material as the first light-blocking pattern 411 and the second light-blocking pattern 412. The first upper supply line 432 may be dispose on the same layer as the first light-blocking pattern 411 and the second light-blocking pattern 412. For example, the first upper supply line 432 may be disposed between the touch passivation layer 370 and the upper passivation layer 390.

The first upper supply line 432 may be electrically connected to the first lower supply line 431. For example, the first upper supply line 432 may extend parallel to the first lower supply line 431. Thus, in the touch display apparatus according to another embodiment of the present disclosure, the touch sensor Cm may be not affected by the external signal by the first upper supply line 432. Therefore, in the touch display apparatus according to another embodiment of the present disclosure, the reliability of the touch sensing by the touch sensor Cm may be improved. And, in the touch display apparatus according to another embodiment of the present disclosure, the resistance of the second power voltage supply line VSS may be reduced. That is, in the touch display apparatus according to another embodiment of the present disclosure, the negative power voltage may be uniformly supplied to each pixel area PA.

In the touch display apparatus according to another embodiment of the present disclosure, a shorting bar 440 electrically connecting the first power voltage supply lines VDD may be disposed between the touch routing lines 330. For example, the shorting bar 440 may be formed simultaneously with the light-blocking pattern 410. The shorting bar 440 may include the same material as the first light-blocking pattern 411 and the second light-blocking pattern 412. The shorting bar 440 may be disposed on the same layer as the first light-blocking pattern 411 and the second light-blocking pattern 412. For example, the shorting bar 440 may be disposed between the touch passivation layer 370 and the upper passivation layer 390. Thus, in the touch display apparatus according to another embodiment of the present disclosure, the positive power voltage may be uniformly supplied to each pixel area PA.

In the result, the touch display apparatus according to the embodiments of the present disclosure may comprise the first light-blocking pattern and the second light-blocking pattern, which are disposed on the touch passivation layer covering the first touch electrodes, the first bridge electrodes and the second touch electrodes, wherein the first light-blocking pattern may be electrically connected to the first touch electrodes and the first bridge electrodes, wherein the second light-blocking pattern may be electrically connected to the second touch electrodes, and wherein the first light-blocking pattern and the second light-blocking pattern may include a conductive material having a lower reflectance than the first touch electrodes and the second touch electrodes. Thus, in the touch display apparatus according to the embodiments of the present disclosure, the resistance of the touch electrodes may be lowered by the first light-blocking pattern and the second light-blocking pattern, and the reflection of the external light may be reduced. Thereby, in the touch display apparatus according to the embodiments of the present disclosure, the reliability of the touch sensing and the quality of realized image may be improved.

What is claimed is:
1. A touch display apparatus comprising:
a device substrate;

a plurality of light-emitting devices on a display area of the device substrate;
an encapsulating layer on the device substrate, the encapsulating layer covering the plurality of light-emitting devices;
a touch insulating layer on the encapsulating layer;
a first touch line on the touch insulating layer, the first touch line including first touch electrodes and first bridge electrodes that electrically connect the first touch electrodes in a first direction;
a second touch line including second touch electrodes and second bridge electrodes, the second bridge electrodes between the encapsulating layer and the touch insulating layer, and electrically connecting the second touch electrodes in a second direction that is different from the first direction;
a touch passivation layer on the touch insulating layer, the first touch electrodes, the first bridge electrodes, and the second touch electrodes disposed between the touch insulating layer and the touch passivation layer;
a first light-blocking pattern on the touch passivation layer, the first light-blocking pattern electrically connected to the first touch electrodes and the first bridge electrodes;
a second light-blocking pattern on the touch passivation layer, the second light-blocking pattern electrically connected to the second touch electrodes; and
a power voltage supply line on the encapsulating layer, the power voltage supply line extending along an edge of the display area, the power voltage supply line including a first supply line and a second supply line on the first supply line,
wherein the first light-blocking pattern and the second light-blocking pattern have a reflectance that is less than reflectances of the first touch electrodes, the first bridge electrodes, and the second touch electrodes, and
wherein the second supply line is electrically connected to the first supply line, and the second supply line includes the same material as the first light-blocking pattern.

2. The touch display apparatus according to claim 1, wherein the second light-blocking pattern is spaced apart from the first light-blocking pattern such that the second light-blocking pattern is non-overlapping with the first light-blocking pattern.

3. The touch display apparatus according to claim 1, wherein the first touch line, the second touch line, the first light-blocking pattern, and the second light-blocking pattern are non-overlapping with the plurality of light-emitting devices.

4. The touch display apparatus according to claim 3, further comprising:
an upper passivation layer covering the first light-blocking pattern and the second light-blocking pattern; and
a plurality of color filters on the upper passivation layer, the plurality of color filters overlapping the plurality of light-emitting devices.

5. The touch display apparatus according to claim 4, wherein the upper passivation layer extends beyond the first light-blocking pattern and the second light-blocking pattern, and the upper passivation layer is in direct contact with the touch passivation layer at the outside of the first light-blocking pattern and the second light-blocking pattern.

6. The touch display apparatus according to claim 3, wherein a planar shape of the first light-blocking pattern is a same as a planar shape of the first touch electrodes and a planar shape of the first bridge electrodes, and
wherein a planar shape of the second light-blocking pattern is a same as a planar shape of the second touch electrodes but not a planar shape of the second bridge electrodes.

7. The touch display apparatus according to claim 6, wherein the second light-blocking pattern is on a same layer as the first light-blocking pattern.

8. The touch display apparatus according to claim 6, wherein the second light-blocking pattern includes a same material as the first light-blocking pattern.

9. The touch display apparatus according to claim 8, further comprising:
a dummy pattern between the first light-blocking pattern and the second light-blocking pattern, the dummy pattern including the same material as the first light-blocking pattern and the second light-blocking pattern, and is spaced away from the first light-blocking pattern and the second light-blocking pattern such that the dummy pattern is non-overlapping with the first light-blocking pattern and the second light-blocking pattern.

10. The touch display apparatus according to claim 1, further comprising:
touch pads on the device substrate, the touch pads spaced away from the encapsulating layer; and
touch routing lines electrically connecting each of the first touch line and the second touch line to a corresponding touch pad from the touch pads,
wherein each of the touch passivation layer, the first light-blocking pattern, and the second light-blocking pattern overlaps a corresponding touch routing line from the touch routing lines.

11. The touch display apparatus according to claim 10, wherein each of the first light-blocking pattern and the second light-blocking pattern is electrically connected to the corresponding touch routing line.

12. The touch display apparatus according to claim 1, wherein the second supply line is parallel to the first supply line.

13. The touch display apparatus according to claim 1, wherein the touch insulating layer and the touch passivation layer are between the first supply line and the second supply line, and the second supply line penetrates the touch insulating layer and the touch passivation layer to electrically connect to the first supply line.

* * * * *